United States Patent
Meisel et al.

(10) Patent No.: US 9,475,693 B2
(45) Date of Patent: Oct. 25, 2016

(54) ASIC ELEMENT, IN PARTICULAR AS A COMPONENT OF A VERTICALLY INTEGRATED HYBRID COMPONENT

(71) Applicant: Robert Bosch GmbH, Stuttgart (DE)

(72) Inventors: Daniel Christoph Meisel, Reutlingen (DE); Christoph Schelling, Stuttgart (DE); Torsten Kramer, Wannweil (DE); Jens Frey, Filderstadt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/732,998

(22) Filed: Jun. 8, 2015

(65) Prior Publication Data

US 2015/0353343 A1 Dec. 10, 2015

(30) Foreign Application Priority Data

Jun. 6, 2014 (DE) .................. 10 2014 210 907

(51) Int. Cl.
- *B81B 7/00* (2006.01)
- *H01L 23/48* (2006.01)
- *H01L 25/065* (2006.01)
- *B81C 1/00* (2006.01)

(52) U.S. Cl.
CPC ........... *B81B 7/007* (2013.01); *B81C 1/00238* (2013.01); *H01L 23/481* (2013.01); *H01L 25/0657* (2013.01); *B81B 2207/012* (2013.01); *B81B 2207/07* (2013.01); *B81C 1/00095* (2013.01); *B81C 2203/0792* (2013.01); *H01L 2924/1461* (2013.01)

(58) Field of Classification Search
CPC ............... H01L 23/481; H01L 23/485; H01L 23/5226; H01L 24/83; H01L 2924/1461; B81C 1/00301; B81C 1/00238; B81C 1/00095; B81B 7/007; B81B 2207/012

See application file for complete search history.

(56) References Cited

U.S. PATENT DOCUMENTS

| | | | |
|---|---|---|---|
| 2002/0040986 A1* | 4/2002 | Sugiyama | H01L 21/82389 257/211 |
| 2008/0128901 A1* | 6/2008 | Zurcher | B81C 1/00238 257/724 |
| 2013/0043547 A1* | 2/2013 | Chu | H01L 24/81 257/415 |
| 2013/0334621 A1* | 12/2013 | Classen | B81B 3/0018 257/415 |
| 2014/0312439 A1* | 10/2014 | Hoegerl | B81C 1/00238 257/416 |

* cited by examiner

*Primary Examiner* — Ermias Woldegeorgis
*Assistant Examiner* — John Bodnar
(74) *Attorney, Agent, or Firm* — Norton Rose Fulbright US LLP

(57) ABSTRACT

Measures are provided which are used for stabilizing the substructure of the connecting areas of ASIC elements. These measures relate to ASIC elements including an ASIC substrate, into which electrical circuit functions are integrated, and including an ASIC layer structure on the ASIC substrate, which includes multiple wiring levels for the circuit functions, which are separated from one another by insulation layers and are interconnected via metallic plugs. At least one connecting area for placing wire bonds or for wafer bonding is implemented in at least one of the uppermost wiring levels. At least one chain of metallic plugs arranged vertically in a direct line is implemented in the ASIC layer structure below the connecting area, which extends from the uppermost wiring level up to the ASIC substrate or oxide trenches introduced therein.

9 Claims, 2 Drawing Sheets

ASIC ELEMENT, IN PARTICULAR AS A COMPONENT OF A VERTICALLY INTEGRATED HYBRID COMPONENT

FIELD OF THE INVENTION

The present invention relates very generally to an ASIC element including an ASIC substrate, into which electrical circuit functions are integrated, and including an ASIC layer structure on the ASIC substrate, which includes multiple wiring levels, which are separated from one another by insulation layers and are interconnected via metallic plugs, for the circuit functions, at least one connecting area being implemented in at least one of the uppermost wiring levels.

The connecting area may be a terminal pad for wire bonds or also a bonding area for installing a further element for the construction of a vertically integrated hybrid component.

BACKGROUND INFORMATION

Vertically integrated hybrid components having at least one MEMS element and at least one ASIC element are of particular significance, the micromechanical and electrical functions of which complement one another. The micromechanical structure of the MEMS element may be used to detect mechanical variables, such as accelerations, rotation rates, or pressure, or also as an actuator, for example, in the form of an activatable valve or loudspeaker. The ASIC element advantageously includes circuit means for measuring signal processing and analysis or for activating the MEMS actuator function.

It is known that the individual elements of a vertically integrated hybrid component may be joined together by bonding to form a chip stack. Both mechanical and also electrical connections are generally established between the part components. Bonding methods additionally enable the implementation of hermetically sealed connections. This is frequently utilized in practice to cap the micromechanical structure of a MEMS element using the ASIC element and thus protect it against environmental influences.

Preferred bonding methods for the construction of vertically integrated hybrid components are silicon direct bonding and eutectic bonding. In these bonding methods, the two wafers to be connected are pressed against one another at an elevated temperature. Wafer bows and surface roughness are compensated for by a relatively high contact pressure. Since this contact pressure is only introduced via the bond contact points into the elements to be connected, the bonding process results in an uneven pressure load of the individual chip areas. This has proven to be problematic in particular for the ASIC element. Specifically, during the ASIC processing, the material of the dielectric insulation layers of the ASIC layer structure is optimized with regard to a preferably low dielectric constant, to minimize RC delays in the printed conductors of the wiring levels. Since the dielectric constant is lower the more porous the dielectric material is, mechanically fragile materials are increasingly being used for the insulation layers of the ASIC layer structure. The risk therefore exists that the functional elements of the ASIC element will be damaged during the bonding process as a result of the low mechanical stability of the individual layers of the ASIC layer structure.

SUMMARY

Measures are provided by the present invention, which are used for stabilizing the substructure of the connecting areas of ASIC elements, so that the contact pressure applied during the wire bonding or wafer bonding is, preferably, homogeneously relayed to the ASIC substrate, without damaging the ASIC layer structure and/or the ASIC functions.

This is achieved according to the invention in that, in the ASIC layer structure below the connecting area, at least one chain of metallic plugs situated vertically in a direct line is implemented, which extends from the uppermost wiring level to the ASIC substrate.

The substructure of the connecting areas of an ASIC element is accordingly stabilized by essentially column-like metal elements in the form of plug chains, which bridge the ASIC layer structure to transfer the contact pressure during a bonding process directly to the ASIC substrate. The manufacture of these plug chains does not require additional manufacturing expenditures, since they may be produced easily together with the plugs, via which the wiring levels of the ASIC layer structure are interconnected. In contrast to these plugs having a solely electrical function, the plug chains in the connecting area of an ASIC element according to the present invention are primarily associated with a mechanical, specifically reinforcing and stabilizing function.

Fundamentally, there are various possibilities for the implementation and refinement of the stabilization measures according to the present invention, which enable an adaptation to the electrical functions and the layout of the ASIC element and in particular also to the connecting areas.

It is particularly advantageous if layer areas below the connecting area in the uppermost wiring level are provided in the layout of at least multiple wiring levels of the ASIC layer structure. These layer areas may then be used as intermediate lands for the plugs of the plug chains and thus promote a homogeneous, planar distribution of the contact pressure force during the bonding process.

Moreover, in addition to the at least one plug chain which extends from the uppermost wiring level to the ASIC substrate, partial chains of metallic plugs situated in a direct line may also be implemented in the ASIC layer structure, which extend below the connecting area over multiple wiring levels, but not over the entire ASIC layer structure. This may be advantageous, for example, if such a plug partial chain is also assigned an electrical function.

In one preferred specific embodiment of the present invention, multiple plug chains and optional plug partial chains are implemented in the ASIC layer structure below the connecting area and situated in a grid, which extends over the connecting area. A very stable substructure is thus provided for the connecting area, which enables a planar and largely homogeneous pressure or force introduction into the ASIC substrate.

To prevent undesirable electrical effects and in particular short-circuits within the ASIC element, individual plug chains may be electrically insulated in relation to the ASIC substrate. For this purpose, insulation areas, for example, in the form of trench insulations (shallow trench insulation or deep trench insulation) are implemented in the surface of the ASIC substrate, on which the affected plug chains and/or plug partial chains of the ASIC layer structure end.

It has proven to be advantageous from a manufacturing aspect to implement the plug chains according to the present invention from the same material as the plugs for interconnecting the wiring levels of the layer structure. Tungsten W and copper Cu are particularly mechanically robust and therefore particularly suitable for the plug chains according to the present invention.

DETAILED DESCRIPTION

Figure 1:
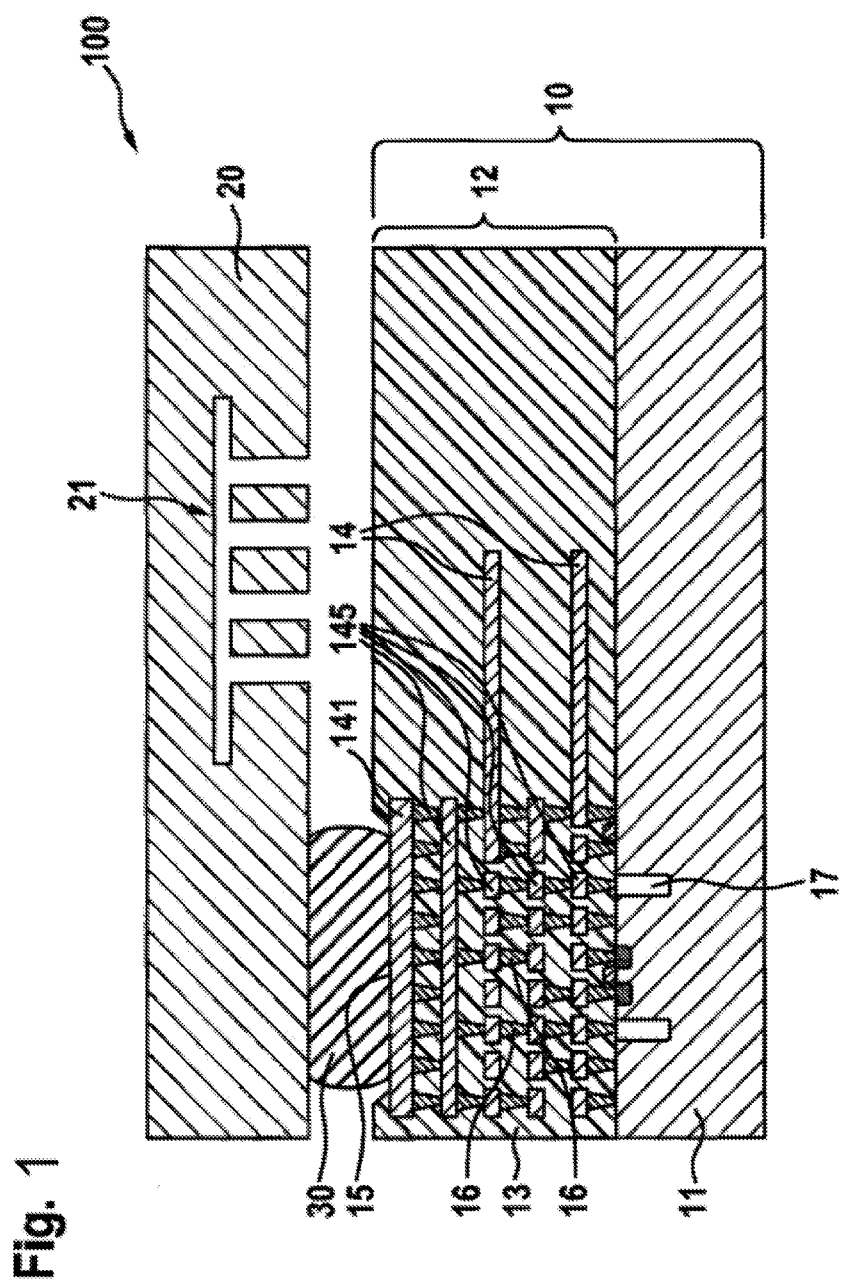
FIG. 1 shows a schematic sectional view of a portion of a vertically integrated hybrid component 100 including an ASIC element 10 according to the present invention.

The portion of a vertically integrated hybrid component 100 shown in FIG. 1 is implemented in the form of a chip stack, which includes an ASIC element 10 and a MEMS element 20.

The structure of ASIC element 10 includes an ASIC substrate 11, into which electrical circuit functions are integrated, which are not shown in detail here, however. An ASIC layer structure 12 is located on ASIC substrate 11, which includes multiple wiring levels 14 for the circuit functions, which are separated from one another by insulation layers 13 and are interconnected via metallic plugs. Since insulation layers 13 of the layer structure are generally formed from the same material, insulation layers 13 are not shown as individual layers here. For reasons of comprehensibility, the wiring levels were only indicated and an illustration of the metallic plugs for interconnecting wiring levels 14 was entirely omitted.

Figure 2:
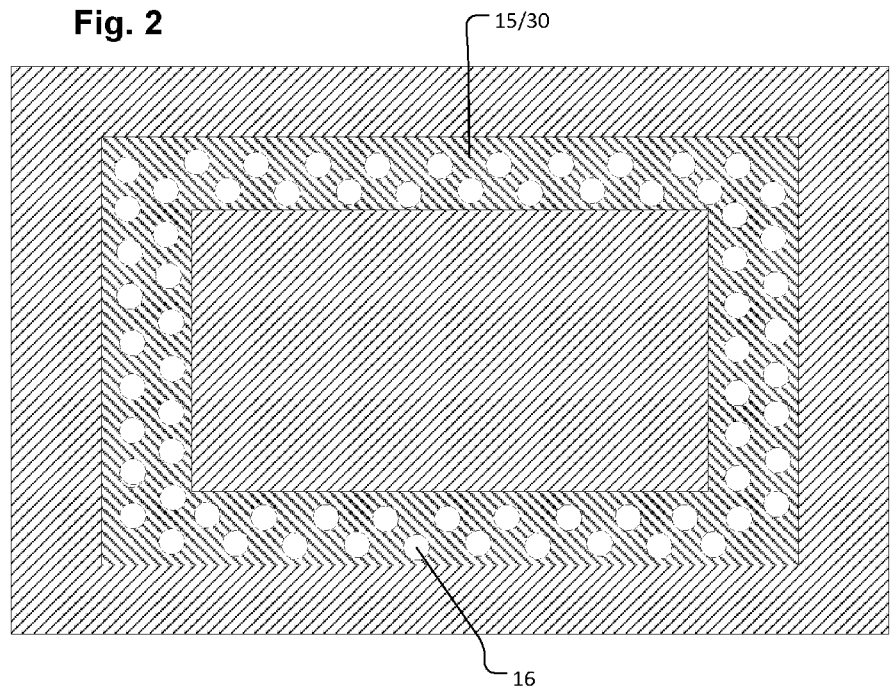
FIG. 2 shows a plan view of the component 100 in which a connecting area is in the form of a circumferential frame, according to an example embodiment of the present invention.
Figure 3:
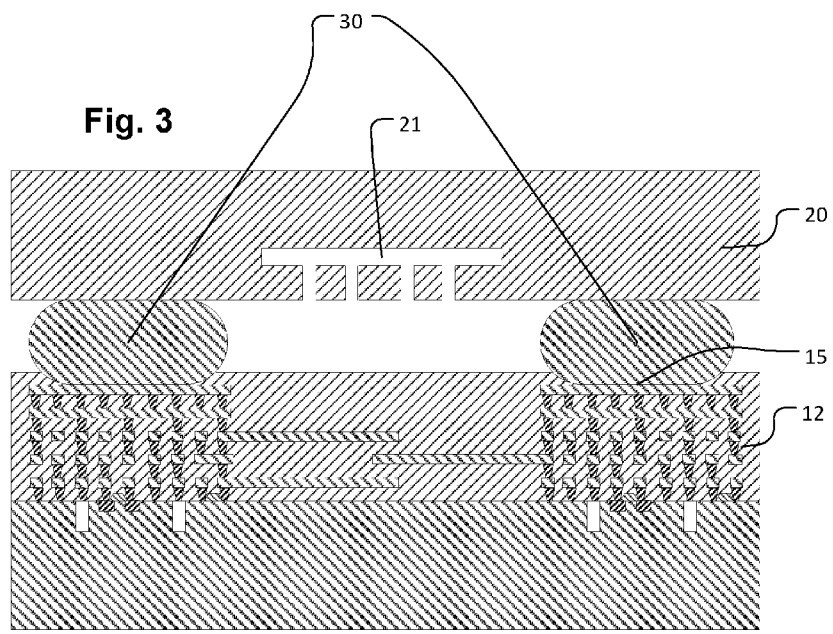
FIG. 3 shows a cross-sectional view of the component 100 of FIG. 2.

A connecting area 15 for the installation of MEMS element 20 is provided and exposed in uppermost wiring level 141 of ASIC layer structure 12. Connecting area 15 is advantageously designed like a circumferential frame, as shown in FIGS. 2 and 3.

The active side, i.e., the front side, in which a micromechanical structure 21 is implemented, of MEMS element 20 was installed in a bonding method on ASIC layer structure 13. A eutectic bonding connection 30, for example, was established in connecting area 15 between ASIC layer structure 13 and MEMS element 20. In the case of a frame-like circumferential design of connecting area 15, this bonding connection 30 enables a hermetic enclosure of micromechanical structure 21 inside the component structure. It is also to be mentioned here that the eutectic bonding connection may also be used for electrical contacting of the two elements in the case of a suitable design of the connecting areas.

To prevent bonding damage in the ASIC functionality, the substructure of connecting area 15 in ASIC layer structure 13 was reinforced and stabilized according to the present invention.

For this purpose, multiple chains of metallic plugs 16 situated vertically in a direct line were implemented below connecting area 15, which extend from uppermost wiring level 141 to ASIC substrate 11 and thus uniformly relay the contact pressure downward to ASIC substrate 11 during the bonding process.

In addition, layer areas 145 are provided below connecting area 15 in the layout of all wiring levels 14 of ASIC layer structure 13 here. These layer areas 145 form intermediate lands for plugs 16 of the plug chains and promote a planar distribution of the contact pressure force. In addition to the plug chains, still more partial chains of metallic plugs 16 situated in a direct line are implemented in the exemplary embodiment shown here, which do also extend over multiple wiring levels 14, but either do not originate from uppermost wiring level 141 or do not extend up to ASIC substrate 11.

The plug chains and plug partial chains are situated in a grid, which extends here over entire connecting area 15. In this way, a punctiform load during the bonding process is prevented; the contact pressure is instead distributed preferably homogeneously over a preferably large volume and relayed via the vertical concatenation of plugs 16 downward to ASIC substrate 11.

The plug chains and plug partial chains of this grid arrangement are predominantly electrically nonfunctional dummy plug chains, which are exclusively used to mechanically homogenize the layer structure and to introduce the contact pressure forces occurring during the bonding process preferably homogeneously into the ASIC substrate. Copper Cu and tungsten W are particularly suitable as materials for this purpose.

Two of the electrically nonfunctional plug chains shown here end on insulation trenches 17 in ASIC substrate 11. In this way, a short-circuit with ASIC substrate 11 is prevented.

What is claimed is:

1. An ASIC element, comprising:
    an ASIC substrate into which electrical circuit functions are integrated;
    and an ASIC layer structure disposed on the ASIC substrate and including:
    multiple wiring levels for the circuit functions, the multiple wiring levels including at least one lower wiring level and at least one upper wiring level;
    insulation layers that separate the wiring levels from one another;
    metallic plugs for interconnecting the circuit functions;
    and at least one connecting area in at least one of the uppermost wiring levels,
    wherein at least one chain is formed by an arrangement of the metallic plugs arranged vertically in a direct line and is implemented in the ASIC layer structure below the connecting area, and at least one of the at least one chain is a complete chain extending from the at least one of the upper wiring levels to the ASIC substrate;
    at least one of the at least one chain ends directly on an insulation trench formed at a surface of the ASIC substrate.

2. The ASIC element as recited in claim 1, further comprising at least one layer area provided below the at least one connecting area in a layout of the wiring levels of the ASIC layer structure, wherein the at least one layer area forms at least one intermediate land for the metallic plugs of the at least one chain.

3. The ASIC element as recited in claim 1, wherein:
    at least one of the at least one chain is a partial chain that extends over multiple ones of the wiring levels, but does not extend through the entire ASIC layer structure from the at least one of the upper wiring levels down to the ASIC substrate.

4. The ASIC element as recited in claim 1, wherein the at least one chain is situated such that, when viewed from a plane above the connecting area, the chains are spaced in a two-dimensional grid that extends at least over a part of the connecting area.

5. The ASIC element as recited in claim 1, wherein the at least one chain is used as an electrical connection.

6. The ASIC element as recited in claim 1, wherein the at least one chain has an exclusively mechanical function.

7. The ASIC element as recited in claim 1, wherein the plugs are made of at least one of tungsten and copper.

8. A vertically integrated hybrid component, comprising:
an ASIC element that includes:
- an ASIC substrate into which electrical circuit functions are integrated;
- an ASIC layer structure disposed on the ASIC substrate and including:
- multiple wiring levels for the circuit functions;
- insulation layers that separate the wiring levels from one another;
- metallic plugs for interconnecting the circuit functions;
- and at least one connecting area in an uppermost one of the uppermost wiring levels, which is farthest, of the wiring levels, away from the ASIC substrate;
- and a further element connected, via a bonding connection in the at least one connecting area, to the ASIC layer structure;

wherein:
- at least one chain is formed by an arrangement of the metallic plugs arranged vertically in a direct line below the connecting area;
- at least one of the at least one chain is a complete chain extending from the uppermost wiring level to the ASIC substrate;
- at least one of the at least one chain ends directly on an insulation trench formed at a surface of the ASIC substrate.

9. The vertically integrated hybrid component as recited in claim 8, wherein the further element includes a MEMS element, the MEMS element having a functional component that is hermetically sealed by the bonding connection to the ASIC element and is electrically connected to the ASIC element.

\* \* \* \* \*